(12) United States Patent
Jurisch

(10) Patent No.: US 10,527,666 B2
(45) Date of Patent: *Jan. 7, 2020

(54) METHOD AND DEVICE FOR DETERMINING THE FAULT LOCATION IN THE CASE OF A FAULT ON AN ELECTRIC LINE

(71) Applicant: SIEMENS AKTIENGESELLSCHAFT, Munich (DE)

(72) Inventor: Andreas Jurisch, Schwante (DE)

(73) Assignee: Siemens Aktiengesellschaft, Munich (DE)

(*) Notice: Subject to any disclaimer, the term of this patent is extended or adjusted under 35 U.S.C. 154(b) by 17 days.

This patent is subject to a terminal disclaimer.

(21) Appl. No.: 15/356,792

(22) Filed: Nov. 21, 2016

(65) Prior Publication Data

US 2017/0146587 A1 May 25, 2017

(30) Foreign Application Priority Data

Nov. 20, 2015 (EP) .................................. 15195561

(51) Int. Cl.
*G01R 31/08* (2006.01)
*G01R 31/02* (2006.01)

(52) U.S. Cl.
CPC ......... *G01R 31/088* (2013.01); *G01R 31/024* (2013.01)

(58) Field of Classification Search
CPC .......... G01R 31/08–086; G01R 31/088; G01R 31/024; G01R 31/021; G01R 31/025; G01R 11/25; G01R 22/068
See application file for complete search history.

(56) References Cited

U.S. PATENT DOCUMENTS

| 4,797,805 A | 1/1989 | Nimmersjoe |
| 5,072,403 A | 12/1991 | Johns |
| (Continued) | | |

FOREIGN PATENT DOCUMENTS

| DE | 3687451 T2 | 7/1993 |
| DE | 68916495 T2 | 10/1994 |

OTHER PUBLICATIONS

Joe-Air, Jiang, et al.; "An Adaptive PMU based fault detection/location technique for transmission lines Part I: Theory and Algorithms;" IEEE Transactions on Power Delivery; No. 15; vol. 2; pp. 486-493; XP055274841; US: ISSN: 0885-8977; DOI: 10.1109/61. 852973; 2000.

*Primary Examiner* — Jarrett J Stark
(74) *Attorney, Agent, or Firm* — Laurence Greenberg; Werner Stemer; Ralph Locher

(57) ABSTRACT

A method determines a fault location in a fault on an electric line. Accordingly first reference voltage values are determined by current and voltage sampled values at a first line end and an impedance of the line. Second reference voltage values are determined by current and voltage sampled values at a second line end and the impedance. Fictitious first reference voltage values are calculated using a wave guiding model, describing the wave response of the line, with the first reference voltage values. The fictitious first reference voltage values, in the fault-free case, correspond to the second reference voltage values at the second line end. Fictitious second reference voltage values are calculated with the second reference voltage values. The fault location is determined by the first and second reference voltage values and the first and second fictitious reference voltage values.

14 Claims, 4 Drawing Sheets

(56) References Cited

U.S. PATENT DOCUMENTS

| | | |
|---|---|---|
| 5,929,642 A | 7/1999 | Philippot et al. |
| 8,655,609 B2 | 2/2014 | Schweitzer, III et al. |
| 2013/0107405 A1* | 5/2013 | Blumschein ......... G01R 31/025 361/79 |
| 2017/0199237 A1* | 7/2017 | Dzienis ................ G01R 31/085 |

* cited by examiner

METHOD AND DEVICE FOR DETERMINING THE FAULT LOCATION IN THE CASE OF A FAULT ON AN ELECTRIC LINE

CROSS-REFERENCE TO RELATED APPLICATION

This application claims the priority, under 35 U.S.C. § 119, of European patent application EP 15195561, filed Nov. 20, 2015; the prior application is herewith incorporated by reference in its entirety.

BACKGROUND OF THE INVENTION

Field of the Invention

The invention relates to a method for determining the fault location in the case of a fault, in particular a short circuit, on an electric line or a line section of the electric line.

A fault locating method, in which a fault is located on the basis of voltage phasors and current phasors established for the mains frequency, is known. In this context, reference is made to e.g. the U.S. Pat. No. 5,929,642; in the method described therein, a relatively high locating accuracy (measurement error approximately 1% to 2%) when locating the fault is obtained with the aid of an estimation method and a nonlinear optimization method, using the current and voltage phasors of both line ends.

Moreover, the practice of evaluating the current flanks, occurring when a fault occurs, of the fault current signal propagating through the line is known (see U.S. Pat. No. 8,655,609 B2). However, identifiable current flanks occurring in the current signal are mandatory for this locating variant. Measurement errors may occur if this is not the case.

SUMMARY OF THE INVENTION

The invention is based on the object of specifying a fault locating method, in which a high locating accuracy is achievable independently of unambiguously identifiable current flanks.

According thereto, provision is made according to the invention for first reference voltage values to be established by current and voltage sampled values at one line end of the line or line section, referred to as first line end below, and the impedance of the line, second reference voltage values to be established by current and voltage sampled values at the other line end of the line or line section, referred to as second line end below, and the impedance of the line, fictitious first reference voltage values to be calculated on the basis of a wave guiding model, describing the wave response of the line, with the first reference voltage values, the fictitious first reference voltage values, in the fault-free case, corresponding to the second reference voltage values at the second line end, and fictitious second reference voltage values to be calculated with the second reference voltage values, the fictitious second reference voltage values, in the fault-free case, correspond to the first reference voltage values at the first line end, and for the fault location to be established by the first and second reference voltage values and the first and second fictitious reference voltage values.

The method according to the invention uses the discovery that—like in the case of the above-described locating method with flank detection—fault currents with relatively high frequencies occur in the case of a fault. However, according to the invention, it is irrelevant—in contrast to the locating method with flank detection—whether or not evaluable current flanks form; this is because, independently of the form of the occurring fault current signal, a very precise locating determination may always take place in the method according to the invention on the basis of only the reference voltage values and the fictitious reference voltage values; i.e., it may also take place in the case of current flanks which are not very distinct or indistinct. In the method according to the invention, this is possible because the fault is located on the basis of reference voltage values and fictitious reference voltage values which are established on the basis of measured voltage values and current values linked to the impedance of the line, and on the basis of a wave guiding model describing the wave response of the line. The reference voltage values and the fictitious reference voltage values, per se, do not describe a physically existing variable but merely form artificial calculation aids and nevertheless—and this is where the inventive idea lies—facilitate accurate locating of a fault on the basis of the wave guiding model, i.e., for example, on the basis of the telegrapher's equation known from radiofrequency technology, even if there is no formation of current flanks that are suitable for evaluating a propagation time difference or sufficiently steep.

The fault location can be established particularly easily, and hence advantageously, using the first and second reference voltage values and the first and second fictitious reference voltage values if a first fictitious fault voltage signal is established by forming the difference between the second fictitious reference voltage values and the first reference voltage values, and a second fictitious fault voltage signal is established by forming the difference between the first fictitious reference voltage values and the second reference voltage values. The two fictitious fault voltage signals are preferably subject to a cross correlation and a cross correlation function is preferably established. The fault location may be established easily and accurately on the basis of the cross correlation function.

Preferably, the fault location is determined on the basis of the temporal shift of the maximum of the cross correlation function in relation to the mid position in the results window of the cross correlation function.

Using the two fictitious fault voltage signals, the cross correlation function $\varphi(\tau)$ is preferably formed in accordance with:

$$\varphi(\tau) = \frac{1}{T} \sum_{-\frac{T}{2}}^{\frac{T}{2}} UFS1(t) \cdot UFS2(t+\tau),$$

where T denotes the temporal length of the results window of the cross correlation function $\varphi(\tau)$ and UFS1 and UFS2 denote the fictitious fault voltage signals.

In a particularly preferred configuration of the method, provision is made for a propagation time difference value to be determined on the basis of the temporal shift of the maximum of the cross correlation function in relation to the mid position in the results window of the cross correlation function, the propagation time difference value specifying the propagation time of the wave of the fault current from the fault location to the respective line end used by the cross correlation function as reference line end.

In other words, the time offset $\tau$, for which the cross correlation function $\varphi(\tau)$ is maximized, may be used as a measure for the time offset with which the fault current at the fault location of the electric line becomes visible at the first line end and the second line end.

By way of example, the fault location can be determined in the form of a distance value in accordance with:

$$LF = \frac{(\text{Im}(\gamma) \cdot l) + (TA - TC)}{2 \cdot \text{Im}(\gamma) \cdot l},$$

where Im($\gamma$) denotes the imaginary part of the complex propagation constant $\gamma$ on the line, l denotes the line length of the line and TA-TC denotes a time offset $\tau$, for which the cross correlation function $\varphi(\tau)$ is maximized, and LF denotes the distance from the fault location.

It is also advantageous if short-circuit warning signals are optionally generated with the fictitious fault voltage signals. Accordingly, provision is made in a preferred configuration of the method for the fictitious fault voltage signals each to be compared to a voltage threshold and a short-circuit warning signal indicating a short circuit on the electric line to be generated if the two fictitious fault voltage signals or at least one thereof reaches or exceeds the voltage threshold. The two fictitious fault voltage signals are preferably only subject to the cross correlation and the cross correlation function is preferably only established if the short-circuit warning signal was generated or if the voltage threshold was reached or exceeded.

The first reference voltage values are preferably established in accordance with:

$$U1 = (Ua + Ia \cdot Z(j\omega)),$$

where U1 denotes the first reference voltage values, Ua denotes voltage values from the first line end, Ia denotes current values from the first line end, and Z(j$\omega$) denotes the impedance.

The second reference voltage values are preferably established in accordance with $$U2 = (Uc + Ic \cdot Z(j\omega)),$$

where U2 denotes the second reference voltage values, Uc denotes voltage values from the second line end, and Ic denotes current values from the second line end.

The fictitious first reference voltage values are, on the basis of the wave guiding model, preferably calculated using the first reference voltage values in accordance with $$U1' = U1 \cdot e^{j\gamma(j\omega) \cdot l},$$

where U1' denotes the fictitious first reference voltage values at the first line end, l denotes the line length of the line, $\omega$ denotes the angular frequency, and $\gamma$ denotes the wave propagation constant on the line.

The fictitious second reference voltage values are, on the basis of the wave guiding model, preferably calculated using the second reference voltage values in accordance with $$U2' = U2 \cdot e^{j\gamma(j\omega) \cdot l},$$

where U2' denotes the fictitious second reference voltage values at the second line end.

The first fictitious fault voltage signal is preferably established by forming the difference between the second fictitious reference voltage values and the first reference voltage values in accordance with:

$$UFS1 = U1 - U2' = U1 - U2 \cdot e^{j\gamma(j\omega) \cdot l},$$

where UFS1 denotes the first fictitious fault voltage signal.

The second fictitious fault voltage signal is preferably established by forming the difference between the first fictitious reference voltage values and the second reference voltage values in accordance with:

$$UFS2 = U2 - U1' = U2 - U1 \cdot e^{j\gamma(j\omega) \cdot l},$$

where UFS2 denotes the second fictitious fault voltage signal.

The first fictitious fault voltage signal and the second fictitious fault voltage signal each, in a descriptive manner, specify a voltage which corresponds to the product of impedance of the line and the fault current $I_F$ at the fault location; i.e. the following applies:

$$UFS1 = I_F \cdot Z(j\omega),$$

$$UFS2 = I_F \cdot Z(j\omega).$$

The first and second reference voltage values and/or the first and second fictitious reference voltage values may be determined in the frequency domain or in the time domain.

If the calculation is carried out in the frequency domain, it is considered to be advantageous if the term Ia·Z(j$\omega$) is calculated in the frequency domain when determining the first reference voltage values U1 by virtue of the current Ia at the first line end being multiplied, in a frequency-related manner, by the impedance Z(j$\omega$), in particular in a frequency-dependent manner, and if the term Ic·Z(j$\omega$) is calculated in the frequency domain when determining second reference voltage values by virtue of the current Ic at the second line end being multiplied, in a frequency-related manner, by the impedance Z(j$\omega$), in particular in a frequency-dependent manner.

In the case of a calculation in the frequency domain, it is moreover advantageous if the fictitious first reference voltage values U1' are calculated in the frequency domain by means of the first reference voltage values U1 by virtue of the first reference voltage values U1 being multiplied by the function $e^{j\gamma(j\omega) \cdot l}$ in a frequency-related manner (or individually for frequencies), and the fictitious second reference voltage values U2' are calculated in the frequency domain by means of the second reference voltage values U2 by virtue of the second reference voltage values U2 being multiplied by the function $e^{j\gamma(j\omega) \cdot l}$ in a frequency-related manner.

If the calculation is carried out in the time domain, it is considered to be advantageous if the term Ia·Z(j$\omega$) is calculated in the time domain when determining the first reference voltage values U1 by virtue of the current sampled values of the current at the first line end being numerically filtered using a first filter reproducing the response of the impedance Z(j$\omega$), and if the term Ic·Z(j$\omega$) is calculated in the time domain when determining the second reference voltage values by virtue of the current sampled values of the current at the second line end being numerically filtered using the first filter or another filter reproducing the response of the impedance Z(j$\omega$).

In the case of a calculation in the time domain, it is moreover advantageous if the fictitious first reference voltage values U1' are calculated in the time domain by the first reference voltage values U1 by virtue of the first reference voltage values U1 being numerically filtered by a second filter reproducing the function $e^{j\gamma(j\omega) \cdot l}$, and if the fictitious second reference voltage values U2' are calculated in the time domain by the second reference voltage values U2 by virtue of the second reference voltage values U2 being numerically filtered by the second filter, or another filter reproducing the function $e^{j\gamma(j\omega) \cdot l}$.

If the frequency dependence of the impedance should be taken into account, it is advantageous if the first filter contains a first order IIR filter and a root former disposed downstream thereof, and takes into account the frequency dependence of the impedance of the electric line.

If the frequency dependence of the impedance should remain unconsidered, for example in order to save computational power, it is advantageous if the first filter contains a multiplication element which multiplies the current sampled values by a constant impedance value.

If the frequency dependence of the damping and of the propagation constant (i.e. the dispersion of the line) should be taken into account, it is advantageous if the second filter contains, or is formed by, an FIR filter and/or an IIR filter.

The invention moreover relates to a fault locating device for determining the fault location in the case of a fault, in particular a short circuit, on an electric line or on a line section of the electric line.

According to the invention, such a fault locating device is distinguished by:

a) one or more reference voltage formers for forming first and second reference voltage values on the basis of current and voltage sampled values at one line end of the line or line section, referred to as first line end below, current and voltage sampled values at the other line end of the line or line section, referred to as second line end below, and the impedance of the line;

b) one or more propagation reproducers for forming fictitious first and fictitious second reference voltage values on the basis of a wave guiding model, describing the wave response of the line, and the first and second reference voltage values, with the fictitious first reference voltage values, in the fault-free case, corresponding to the second reference voltage values at the second line end and the fictitious second reference voltage values, in the fault-free case, corresponding to the first reference voltage values at the first line end; and c) an evaluation unit, which establishes the fault location using the first and second reference voltage values and the first and second fictitious reference voltage values or using first and second fictitious fault voltage signals, which were formed by the first and second reference voltage values and the first and second fictitious reference voltage values.

In respect of the fault locating device according to the invention, reference is made to the explanations above in conjunction with the method according to the invention.

It is advantageous if the fault locating device contains one or more difference formers for forming the first fictitious fault voltage signal and the second fictitious fault voltage signal, the difference former or formers forming the first fictitious fault voltage signal by forming the difference between the second fictitious reference voltage values and the first reference voltage values and forming the second fictitious fault voltage signal by forming the difference between the first fictitious reference voltage values and the second reference voltage values.

Moreover, it is advantageous if the evaluation unit contains a cross correlator, which subjects the two fictitious fault voltage signals to a cross correlation and establishes a cross correlation function, a maximum value determination device, which establishes the maximum value of the cross correlation function and the associated time offset, and a position determining device, which determines the fault location on the basis of the time offset.

The fault locating device can be formed particularly easily and advantageously by a computer device, in particular a microprocessor device, and a memory connected therewith.

The memory preferably contains a multiplicity of software modules, of which—when run by the computer device—one or more form the reference voltage formers for forming the first and second reference voltage values, one or more form the propagation reproducers for forming the fictitious first and second reference voltage values, one or more form the difference formers, one or more form the threshold comparison devices, and one or more form the evaluation unit, in particular the cross correlator thereof, the maximum value determination device thereof and the position determination device thereof.

Other features which are considered as characteristic for the invention are set forth in the appended claims.

Although the invention is illustrated and described herein as embodied in a method and a device for determining the fault location in the case of a fault on an electric line, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

In the figures, the same reference signs are used for identical or comparable or functionally similar components.

Figure 1:
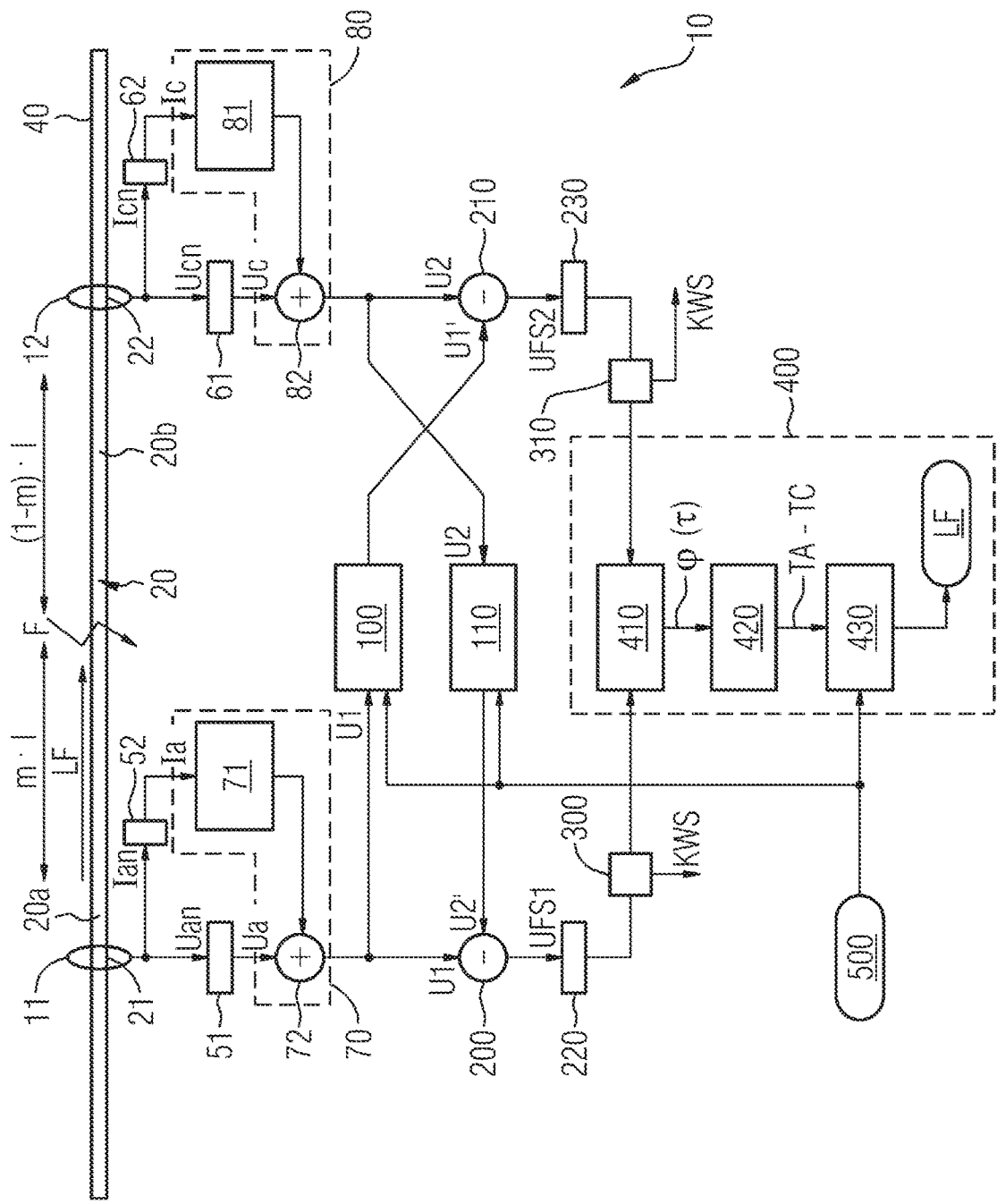
FIG. 1 is an illustration of an exemplary embodiment for a fault locating device, in which reference voltage values and fictitious reference voltage values are formed in a frequency domain according to the invention.

Referring now to the figures of the drawings in detail and first, particularly to FIG. 1 thereof, there is shown an exemplary embodiment of a fault locating device 10 which is suitable for determining the fault location F in the case of a fault, in particular a short circuit, on an electric line 20. The fault locating device 10 is connected to a first line end 21 of the line 20 at a first measuring position 11 and to a second line end 22 of the line 20 at a second measuring position 12.

The line 20 may—as shown in an exemplary manner in FIG. 1—be a line section of a longer transmission line 40; in this case, the line ends 21 and 22 form section ends of the section of the transmission line 40 monitored by the fault locating device 10.

On the input side, the fault locating device 10 contains four Fourier transform devices 51, 52, 61 and 62.

The Fourier transform device 51 converts voltage sampled values Uan from the first measuring position 11 or from the first line end 21 into frequency-related voltage values Ua.

The Fourier transform device 52 converts current sampled values Ian from the first measuring position 11 or from the first line end 21 into frequency-related current values Ia.

The Fourier transform device 61 converts voltage sampled values Ucn from the second measuring position 12 or from the second line end 22 into frequency-related voltage values Uc; and the Fourier transform device 62 converts current sampled values Icn from the second measuring position 12 or from the second line end 22 into frequency-related current values Ic.

A first reference voltage former 70 is disposed downstream of the two Fourier transform devices 51 and 52, the reference voltage former 70 having a multiplication element 71 and an addition element 72. For a predetermined frequency range, which preferably covers a range from 50 Hz to 1 MHz, the multiplication element 71 and the addition element 72 use the frequency-related voltage values Ua and the frequency-related current values Ia to form first frequency-related reference voltage values U1 for the first line end 21 in accordance with:

$$U1 = (Ua + Ia \cdot Z(j\omega)),$$

where $Z(j\omega)$ denotes the frequency-dependent impedance of the line 20 and $\omega$ denotes the angular frequency.

A second reference voltage former 80 is disposed downstream of the two Fourier transform devices 61 and 62, said reference voltage former having a multiplication element 81 and an addition element 82. The multiplication element 81 and the addition element 82 use the frequency-related voltage values Uc and the frequency-related current values Ic to form second frequency-related reference voltage values U2 for the second line end 22 in accordance with:

$$U2 = (Uc + Ic \cdot Z(j\omega)).$$

Using the first reference voltage values U1, a first propagation reproducer 100 forms fictitious first frequency-related reference voltage values U1' on the basis of a predetermined wave guiding model, which describes the response of the line 20, for the predetermined frequency range, preferably by frequency-related multiplication in accordance with $$U1' = U1 \cdot e^{j\gamma(j\omega)\cdot l},$$

where l denotes the line length of the line 20 and $\gamma$ denotes the wave propagation constant on the line 20.

In the fault-free case, the fictitious first reference voltage values U1' are identical to, or at least do not deviate substantially from, the second reference voltage values U2 at the second line end 22 because the influence of the electric line is taken into account by the wave guiding model.

Using the second reference voltage values U2, a second propagation reproducer 110, in a corresponding manner, forms fictitious second frequency-related reference voltage values U2' on the basis of the wave guiding model for the predetermined frequency range, preferably by frequency-related multiplication in accordance with $$U2' = U2 \cdot e^{j\gamma(j\omega)\cdot l}.$$

In the fault-free case, the fictitious second reference voltage values U2' are identical to, or at least do not deviate substantially from, the first reference voltage values U1 at the first line end 21 because the influence of the electric line is taken into account by the wave guiding model.

Disposed downstream of the reference voltage former 70 and the second propagation reproducer 110 is a first difference former 200 which, by forming the difference between the second fictitious reference voltage values U2' and the first reference voltage values U1, establishes a first fictitious fault voltage signal UFS1 in accordance with $$UFS1 = U1 - U2' = U1 - U2 \cdot e^{j\gamma(j\omega)\cdot l}.$$

Disposed downstream of the second reference voltage former 80 and the first propagation reproducer 100 is a second difference former 210 which, by forming the difference between the first fictitious reference voltage values U1' and the second reference voltage values U2, establishes a second fictitious fault voltage signal UFS2 in accordance with $$UFS2 = U2 - U1' = U2 - U1 \cdot e^{j\gamma(j\omega)\cdot l}.$$

In the fault-free case or without faults on the electric line 20, UFS1 and UFS2 each equal zero or each at least approximately equal zero.

An inverse Fourier transform device 220 disposed downstream of the first difference former 200 transforms the first fictitious fault voltage signal UFS1 into the time domain and an inverse Fourier transform device 230 disposed downstream of the difference former 210 transforms the second fictitious fault voltage signal UFS2 into the time domain.

The two fictitious fault voltage signals UFS1 and UFS2 are each compared to a voltage threshold by threshold comparison devices 300 and 310 after the transformation into the time domain, and a short-circuit warning signal KWS indicating a short circuit on the electric line 20 is generated if both fictitious fault voltage signals UFS1 and UFS2, or at least one thereof, reaches or exceeds the voltage threshold.

If the short-circuit warning signal KWS is present, a cross correlator 410, disposed downstream, of an evaluation device 400 is put into operation, the cross correlator subjecting the two fictitious fault voltage signals UFS1 and UFS2 to a cross correlation and forming a cross correlation function $\varphi(\tau)$, for example related to the first line end 21 of the line 20 in accordance with:

$$\varphi(\tau) = \frac{1}{T} \sum_{-\frac{T}{2}}^{\frac{T}{2}} UFS1(t) \cdot UFS2(t + \tau),$$

where T denotes the temporal length of the results window of the cross correlation function $\varphi(\tau)$.

The time offset $\tau$ at which the cross correlation function $\varphi(\tau)$ is at a maximum is a measure for the time offset TA-TC at which the fault current at the fault location F of the electric line becomes visible at the first line end 21 and the second line end 22. In other words, the fault location F can be determined on the basis of the temporal shift TA-TC of the maximum of the cross correlation function in relation to the mid position in the results window of the cross correlation function.

Figure 3:
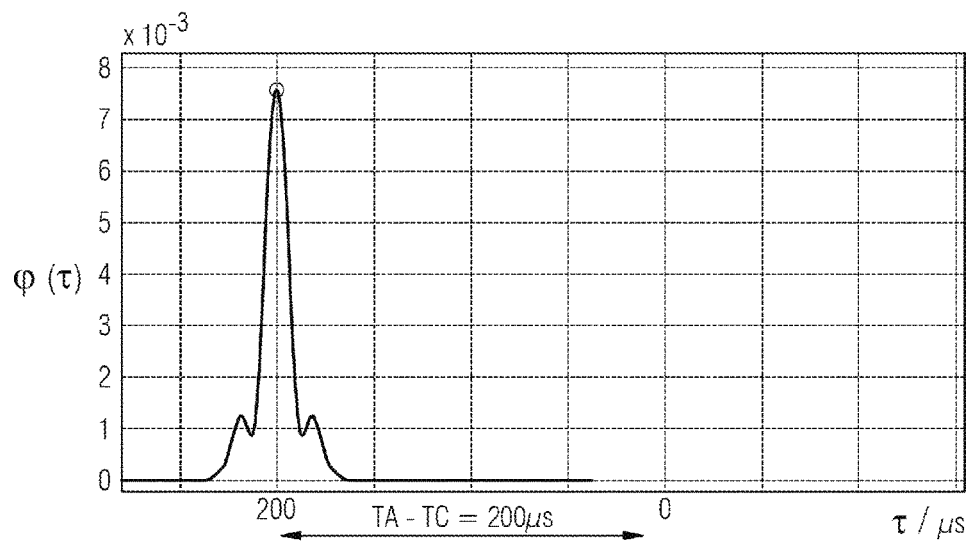
FIG. 3 is a graph showing an exemplary curve of a cross correlation function, which was formed by the cross correlation of two fault voltage signals.

This is shown in an exemplary manner in FIG. 3. An exemplary curve of the cross correlation function $\varphi(\tau)$ and an offset TA-TC of 200 μs, which indicates the distance of the fault location from the line center of the line 20, are visible. If the fault were to occur exactly in the middle, the offset TA-TC would equal zero; the offset TA-TC would be at a maximum in the case of a fault location F in the vicinity of one of the two line ends, with the sign of the offset indicating whether the fault location F is offset in the direction of the first line end or a second line end in relation to the line center.

In the exemplary embodiment in accordance with FIG. 1, the maximum of the cross correlation function $\varphi(\tau)$ is established by a maximum value determination device 420, which has a position determination device 430 disposed downstream thereof.

The position determination device 430 determines the fault location F on the line 20 in the form of a distance value LF—for example related to the first line end 21—, preferably in accordance with:

$$LF = m \cdot l = \frac{(\text{Im}(\gamma) \cdot l) + (TA - TC)}{2 \cdot (\text{Im}(\gamma) \cdot l)},$$

where Im($\gamma$) denotes the imaginary part of the complex propagation constant $\gamma$ of the line 20, l denotes the line length of the line 20 and TA-TC denotes the time offset $\tau$, for which the cross correlation function $\varphi(\tau)$ is maximized.

Preferably, provision is made of a parameterization device 500 for parameterizing or adjusting the propagation reproducers 100 and 110, and for parameterizing or adjusting the position determination device 430.

Figure 2:
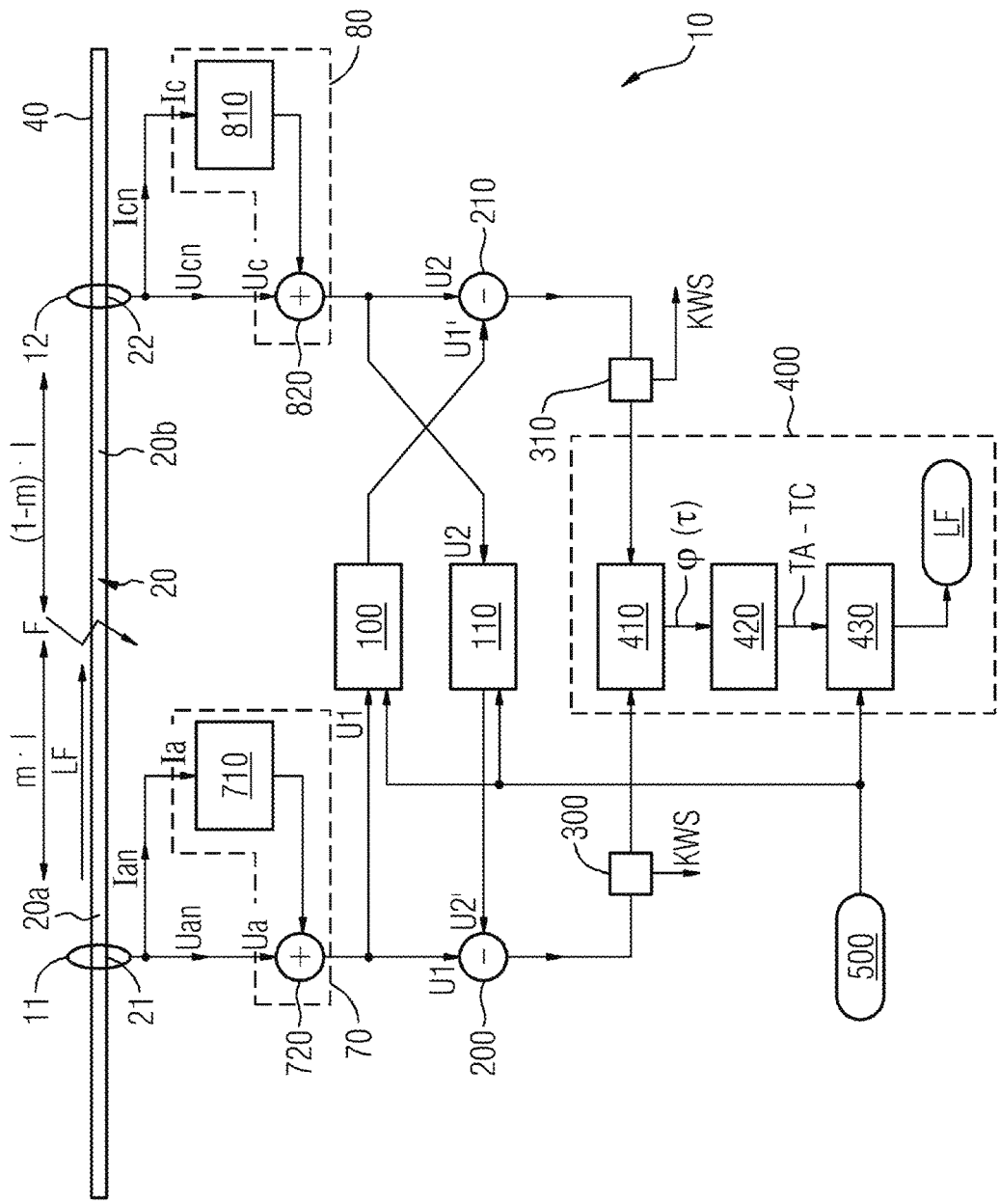
FIG. 2 is an illustration of an exemplary embodiment for the fault locating device, in which the reference voltage values and the fictitious reference voltage values are formed in a time domain.

FIG. 2 shows a further exemplary embodiment for a fault locating device 10 which is suitable for determining the fault location F in the case of a fault, in particular a short circuit, on an electric line 20. As is yet to be explained in more detail below, the reference voltage formers 70 and 80 and the propagation reproducers 100 and 110 operate in the time domain—in contrast to the exemplary embodiment in accordance with FIG. 1, in which these components operate in the frequency domain.

The fault locating device 10 is connected to a first line end 21 of the line 20 at a first measuring position 11 and to a second line end 22 of the line 20 at a measuring position 12 and, in this respect, corresponds to the exemplary embodiment in accordance with FIG. 1.

Connected to the first measuring position 11 is a first reference voltage former 70, which directly processes the voltage sampled values Uan and the current sampled values Ian from the first measuring position 11 as time-related voltage values Ua and as time-related current values Ia.

The first reference voltage former 70 has a first filter 710 and an addition element 720.

The first filter 710 numerically filters the time-related current values Ia in the time domain in such a way that the time curve of the filtered current values corresponds to a curve as would arise in the case of a multiplication of the current values Ia in the frequency domain by a frequency-dependent impedance Z(j$\omega$) (see above).

Figure 4:
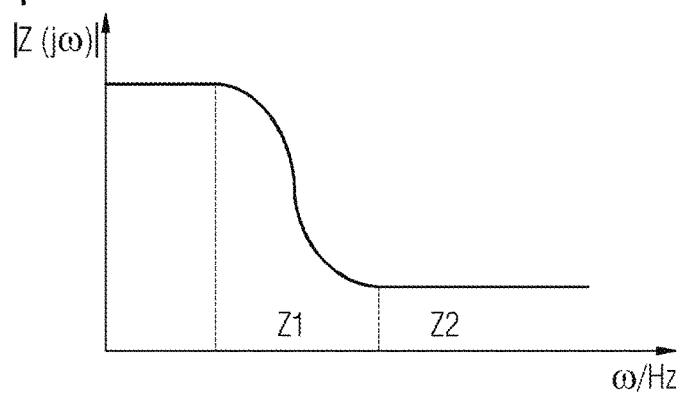
FIG. 4 is a graph showing a typical qualitative curve of the absolute value of the impedance of an electric line, plotted against frequency.

The frequency dependence of the frequency-dependent impedance Z(j$\omega$) is shown in a simplified exemplary manner in FIG. 4 for a typical energy transmission line. It is possible to identify a very frequency-dependent range Z1, which lies between approximately 1 Hz and 2 kHz and, in comparison therewith, a relatively frequency-independent range Z2, which extends from approximately 2 kHz to approximately 1 MHz.

In the case where the first filter 710 should take account of both ranges Z1 and Z2, the first filter 710 preferably contains a first order IIR filter (digital filter with infinite impulse response) and a root former disposed downstream thereof.

In the case where the first filter 710 should merely take account of the range Z2, for example for the purposes of minimizing the required computational power, the first filter 710 preferably contains a multiplication element, which multiplies the time-related current values by a constant impedance value.

Therefore, using the time-related voltage values Ua and the time-related current values Ia, the first filter 710 and the addition element 720 form, for a predetermined frequency range, first time-related reference voltage values U1 for the first line end 21 in accordance with:

$$U1 = (Ua + Ia \cdot Z(j\omega)).$$

Connected to the second measuring position 12 is a second reference voltage former 80, which directly processes the voltage sampled values Ucn and the current sampled values Icn from the second measuring position 12 as time-related voltage values Uc and as time-related current values Ic.

The second reference voltage former 80 preferably has a first filter 810 and an addition element 820, which may have exactly the same configuration as a first filter 710 and the addition element 720 of the first reference voltage former 70. In other words, the first filter 810 and the addition element 820 of the second reference voltage former 80 may be identical to the first filter 710 and the addition element 720 of the first reference voltage former 70.

The first filter 810 of the second reference voltage former 80 numerically filters the time-related current values Ic in the time domain in such a way that the time curve of the filtered current values corresponds to a curve as would arise in the case of a multiplication of the current values Ic in the frequency domain by the frequency-dependent impedance Z(j$\omega$) (see above).

Therefore, using the time-related voltage values Uc and the time-related current values Ic, the first filter 810 and the addition element 820 of the second reference voltage former 80 form, for a predetermined frequency range, second time-related reference voltage values U2 for the second line end 22 in accordance with:

$$U2 = (Uc + Ic \cdot Z(j\omega)).$$

A first propagation reproducer 100 of the fault locating device 10 is preferably formed by a second filter in the form of an FIR filter (digital filter with a finite impulse response) and/or an IIR filter, the filter taking account of the frequency dependence of the damping and the frequency dependence of the propagation constant of the electric line 20.

The first propagation reproducer 100 forms fictitious first time-related reference voltage values U1' in the time domain on the basis of the predetermined wave guiding model, which describes the response of the line 20, and using the first reference voltage values U1 such that it would correspond to multiplication by the term $e^{j \cdot \gamma(j\omega) \cdot l}$ in the frequency range, and so the following is obtained:

$$U1' = U1 \cdot e^{j \cdot \gamma(j\omega) \cdot l},$$

where l denotes the line length of the line and $\gamma$ denotes the wave propagation constant on the line.

The fictitious first reference voltage values U1' correspond to the second reference voltage values U2 at the second line end 22 in the fault-free case.

Correspondingly, a second propagation reproducer 110 of the fault locating device 10 forms fictitious second time-related reference voltage values U2' on the basis of the wave guiding model and using the second reference voltage values U2, and the following is obtained:

$$U2'=U2 \cdot e^{j\gamma(j\omega) \cdot l}.$$

The fictitious second reference voltage values U2' correspond to the first reference voltage values U1 at the first line end 21, or are identical therewith, in the fault-free case.

Preferably, the two propagation reproducers 100 and 110 have the same design or are identical.

Disposed downstream of the propagation reproducers 100 and 110, there preferably are difference formers 200 and 210, threshold comparison devices 300 and 310 and an evaluation device 400, which could be identical to the corresponding components in the exemplary embodiment in accordance with FIG. 1; therefore, reference is made to the explanations above in this respect.

Figure 7:
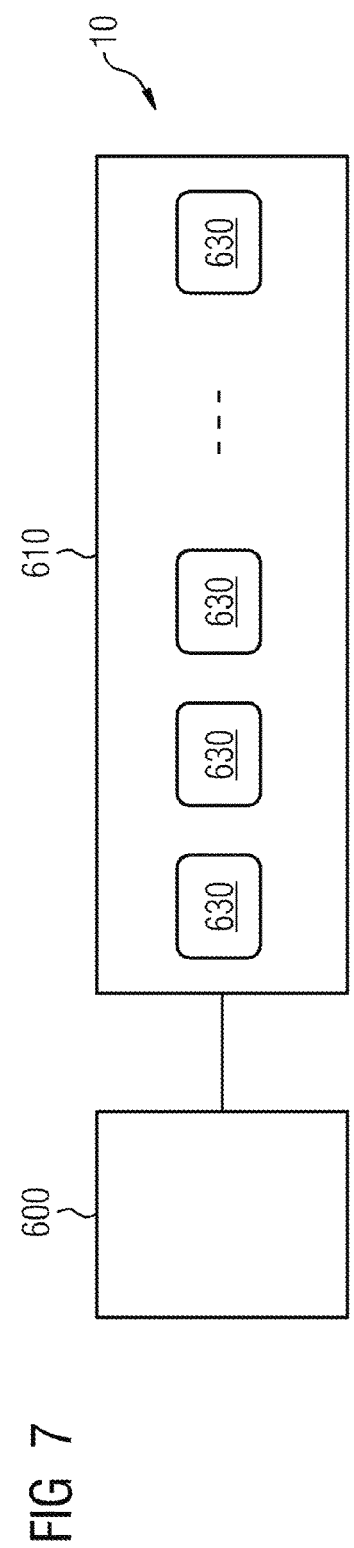
FIG. 7 is a block diagram of an exemplary embodiment of a fault locating device, which is formed by a computer device and a memory or at least also contains these components.

The fault locating device 10 in accordance with FIGS. 1 and 2 may be formed particularly easily and advantageously by a computer device 600, in particular a microprocessor device, and a memory 610 connected therewith (see FIG. 7). The memory 610 preferably has a multiplicity of software modules 630, of which—when run by the computer device 600—one or more form the reference voltage formers 70 and 80 for forming the first and second reference voltage values, one or more form the propagation reproducers 100 and 110 for forming the fictitious first and second reference voltage values, one or more form the difference formers 200 and 210, one or more form the threshold comparison devices 300 and 310, and one or more form the evaluation unit 400, in particular the cross correlator 410 thereof, the maximum value determination device 420 thereof and the position determination device 430 thereof.

Figure 5:
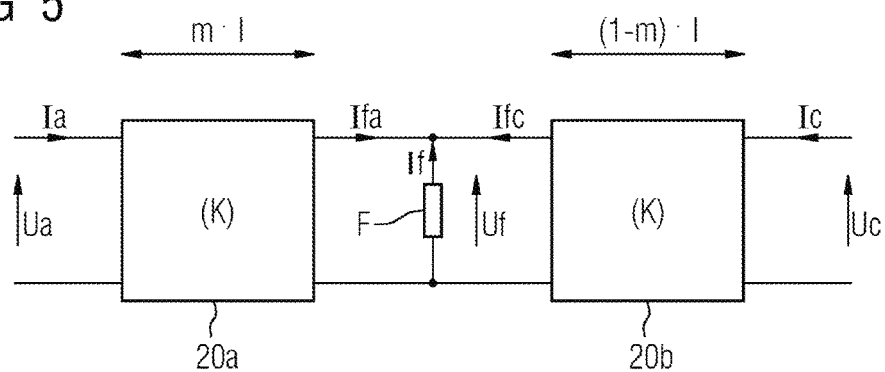
FIG. 5 is a block diagram of a wave transmission model for an electric line in the case of an electric fault on the line.

In conjunction with FIG. 5, the above-described principle of locating the fault should be explained in more detail mathematically on the basis of the wave guiding model using the well-known telegrapher's equation.

Using the telegrapher's equation, the line 20 in accordance with FIGS. 1 and 2 may be described by a 2×2 matrix in accordance with:

$$\begin{pmatrix} Uc \\ Ic \end{pmatrix} = (K) \cdot \begin{pmatrix} Ua \\ Ia \end{pmatrix} = \begin{pmatrix} k_{11} & k_{12} \\ k_{21} & k_{22} \end{pmatrix} \cdot \begin{pmatrix} Ua \\ Ia \end{pmatrix},$$

where $$K = \begin{pmatrix} \cosh(\gamma(j\omega) \cdot l) & Z_W(j\omega) \cdot \sinh(\gamma(j\omega) \cdot l) \\ \frac{1}{Z_W(j\omega)} \cdot \sinh(\gamma(j\omega) \cdot l) & \cosh(\gamma(j\omega) \cdot l) \end{pmatrix},$$

$$Z_W(j\omega) = \sqrt{\frac{R'(j\omega) + i\omega \cdot L'}{G' + i\omega \cdot C'}},$$

and $$\gamma(j\omega) = \sqrt{(R'(j\omega) + i\omega \cdot L') \cdot (G' + i\omega \cdot C')},$$

where R' denotes the length-related ohmic resistance of the line 20, L' denotes the length-related inductance of the line 20, C' denotes the length-related capacitance of the line 20 and G' denotes the length-related conductance of the line 20.

If a fault now occurs at the fault location F, the line 20 is subdivided into a first section 20a of length m*l and a second section 20b of length (1−m)*l (see FIGS. 1 and 5). Now, the following relationships apply to both sections 20a and 20b:

$$Uf = Ifa \cdot Z(j\omega) = (Ua + Ia \cdot Z(j\omega)) \cdot e^{j\gamma(j\omega) \cdot m \cdot l},$$

$$Uf = Ifc \cdot Z(j\omega) = (Uc + Ic \cdot Z(j\omega)) \cdot e^{j\gamma(j\omega) \cdot (1-m) \cdot l}, \text{ and}$$

$$0 = Ifa + Ifc + If.$$

By combining the equations, $$If \cdot Z(j\omega) = (Ua + Ia - Z(j\omega)) \cdot e^{j\gamma(j\omega) \cdot m \cdot l} - (Uc + Ic \cdot Z(j\omega)) \cdot e^{j\gamma(j\omega) \cdot (1-m) \cdot l}$$

is obtained, as a result of which the locating of faults as described in conjunction with FIGS. 1 and 2 is facilitated.

Figure 6:
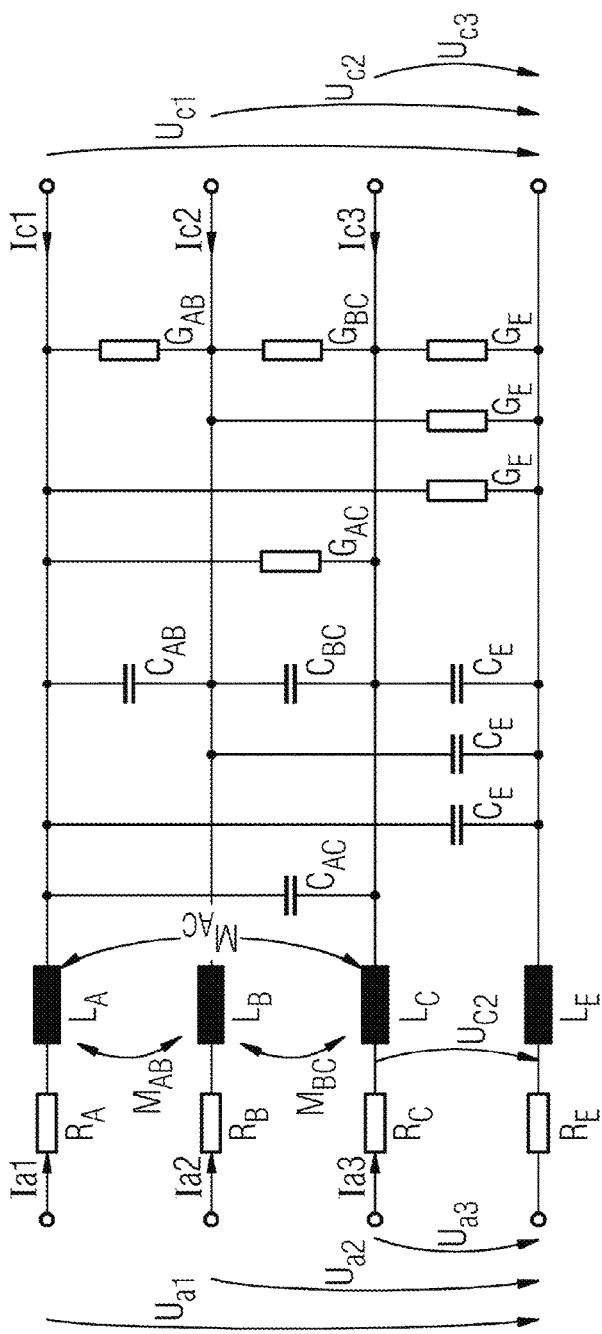
FIG. 6 is a schematic illustration of an electric equivalent circuit diagram of a three-phase electric line with coupled phase conductors.

If the line 20 is a multi-phase line in which the phase conductors are electrically coupled, it is advantageous to initially "decouple" the phase conductors mathematically; this should be explained below using the example of a three-phase line and the Clark transform:

FIG. 6 shows a three-phase line 20, in which the conductor phases are coupled to one another by coupling inductances $M_{AB}$, $M_{BC}$, $M_{AC}$, coupling capacitances $C_{AB}$, $C_{BC}$, $C_{AC}$, and coupling conductances $G_{AB}$, $G_{BC}$, $G_{AC}$.

Thus, the following applies to the phase voltages Ua1 to Ua3 and Uc1 to Uc3 and the phase currents Ia1 to Ia3 and Ic1 to Ic3:

$$\begin{pmatrix} Uc1 \\ Uc2 \\ Uc3 \\ Ic1 \\ Ic2 \\ Ic3 \end{pmatrix} = \begin{pmatrix} Y^{-1} \cdot (Y^{-1} + Z)^{-1} & Z \\ Y & Y^{-1} \cdot (Y^{-1} + Z)^{-1} \end{pmatrix} \cdot \begin{pmatrix} Ua1 \\ Ua2 \\ Ua3 \\ Ia1 \\ Ia2 \\ Ia3 \end{pmatrix}$$

with $$Z = \begin{pmatrix} R_A & 0 & 0 \\ 0 & R_B & 0 \\ 0 & 0 & R_C \end{pmatrix} + R_E \cdot \begin{pmatrix} 1 & 1 & 1 \\ 1 & 1 & 1 \\ 1 & 1 & 1 \end{pmatrix} + j\omega \cdot \begin{pmatrix} L_A & M_{AB} & M_{AC} \\ M_{AB} & L_B & M_{BC} \\ M_{AC} & M_{BC} & L_C \end{pmatrix} + j\omega L_E \cdot \begin{pmatrix} 1 & 1 & 1 \\ 1 & 1 & 1 \\ 1 & 1 & 1 \end{pmatrix}$$

and $$Y = \begin{pmatrix} G_{AB} + G_{AC} & -G_{AB} & -G_{AC} \\ -G_{AB} & G_{AB} + G_{BC} & -G_{BC} \\ -G_{AC} & -G_{BC} & G_{AC} + G_{BC} \end{pmatrix} + G_E \cdot \begin{pmatrix} 1 & 0 & 0 \\ 0 & 1 & 0 \\ 0 & 0 & 1 \end{pmatrix} +$$

$$j\omega \cdot \begin{pmatrix} C_{AB} + C_{AC} & -C_{AB} & -C_{AC} \\ -C_{AB} & C_{AB} + C_{BC} & -C_{BC} \\ -C_{AC} & -C_{BC} & C_{AC} + C_{BC} \end{pmatrix} + j\omega C_E \cdot \begin{pmatrix} 1 & 0 & 0 \\ 0 & 1 & 0 \\ 0 & 0 & 1 \end{pmatrix}$$

Since the matrices (Y) and (Z) have real eigenvalues, it is possible to obtain matrix decoupling with the aid of known mathematical methods—in particular on the basis of the Clark transform with the components 0, α and β thereof, and the method of eigenvectors and a matrix diagonalization—in such a way that, for each component 0, α and β, the line may respectively be described by a 2×2 matrix and the fault locating may be carried out as described in conjunction with FIGS. 1 and 2.

Even though the invention was described in detail and illustrated more closely by preferred exemplary embodiments, the invention is not restricted by the disclosed examples and other variations may be derived therefrom by a person skilled in the art without departing from the scope of protection of the invention.

The invention claimed is:

1. A method for determining a fault location in a case of a fault on an electric line or a line section of the electric line, which comprises the steps of:
   determining, using a computer processor, first reference voltage values by means of current and voltage sampled values at a first line end of the electric line or the line section and an impedance of the electric line;
   determining, using a computer processor, second reference voltage values by means of current and voltage sampled values at a second line end of the electric line or the line section and the impedance of the electric line;
   calculating, using a computer processor, fictitious first reference voltage values on a basis of a wave guiding model, describing a wave response of the electric line, with the first reference voltage values, the fictitious first reference voltage values, in a fault-free case, corresponding to the second reference voltage values at the second line end and calculating fictitious second reference voltage values with the second reference voltage values, the fictitious second reference voltage values, in the fault-free case, corresponding to the first reference voltage values at the first line end;
   generating a first fictitious fault voltage signal by forming a difference between the second fictitious reference voltage values and the first reference voltage values;
   generating a second fictitious fault voltage signal by forming a difference between the first fictitious reference voltage values and the second reference voltage values;
   subjecting the first and second fictitious fault voltage signals to a cross correlation and a cross correlation function is established;
   determining the fault location on a basis of a temporal shift of a maximum of the cross correlation function in relation to a mid position in a results window of the cross correlation function;
   using the determined fault location to locate the fault on the electric line or the line section of the electric line; and
   further generating a short circuit warning signal indicating a fault on the electric line or the line section of the electric line if a fault is detected.

2. The method according to claim 1, which further comprises determining a propagation time difference value on a basis of the temporal shift of the maximum of the cross correlation function in relation to the mid position in the results window of the cross correlation function, the propagation time difference value specifying a propagation time of a wave of a fault current from the fault location to a respective line end used by the cross correlation function as a reference line end.

3. The method according to claim 1, which further comprises:
   comparing each of the first and second fictitious fault voltage signals to a voltage threshold; and
   wherein said further generating step includes generating the short-circuit warning signal indicating a short circuit on the electric line if the first and second fictitious fault voltage signals or at least one thereof reaches or exceeds a voltage threshold, and the first and second fictitious fault voltage signals are only subject to the cross correlation and the cross correlation function is only established if the short-circuit warning signal was generated.

4. The method according to claim 1, which further comprises:
   determining the first reference voltage values in accordance with:

$(U1=(Ua|Ia\cdot Z(j\omega)))$, where U1 denotes the first reference voltage values, Ua denotes voltage values from the first line end, Ia denotes current values from the first line end, and $Z(j\omega)$ denotes the impedance,
   determining the second reference voltage values in accordance with:

$U2=(Uc+Ic\cdot Z(j\omega))$, where U2 denotes the second reference voltage values, Uc denotes voltage values from the second line end, and Ic denotes current values from the second line end;
   calculating the first and second fictitious first reference voltage values, on a basis of the wave guiding model, using the fictitious first reference voltage values in accordance with $U1'=U1\cdot e^{j\gamma(j\omega)\cdot l}$, where U1' denotes the fictitious first reference voltage values at the first line end, l denotes a line length of the electric line, ω denotes an angular frequency, and γ denotes a wave propagation constant on the electric line;
   calculating the fictitious second reference voltage values, on a basis of the wave guiding model, using the second reference voltage values in accordance with $U2'=U2\cdot e^{j\gamma(j\omega)\cdot l}$, where U2' denotes the fictitious second reference voltage values at the second line end;
   determining the first fictitious fault voltage signal by forming a difference between the second fictitious reference voltage values and the first reference voltage values in accordance with:

$UFS1=U1-U2'=U1-U2\cdot e^{j\gamma(j\omega)\cdot l}$, where UFS1 denotes the first fictitious fault voltage signal; and
   determining the second fictitious fault voltage signal by forming the difference between the first fictitious reference voltage values and the second reference voltage values in accordance with:

$UFS2=U2-U1'=U2-U1\cdot e^{j\gamma(j\omega)\cdot l}$, where UFS2 denotes the second fictitious fault voltage signal.

5. The method according to claim 1, which further comprises determining the first and second reference voltage values and/or the first and second fictitious reference voltage values in a frequency domain.

6. The method according to claim 1, which further comprises:
   calculating a term $Ia\cdot Z(j\omega)$ in a frequency domain when determining the first reference voltage values by virtue of current Ia at the first line end being multiplied, in a frequency-related manner, by the impedance $Z(j\omega)$, in a frequency-dependent manner; and
   calculating a term $Ic\cdot Z(j\omega)$ in the frequency domain when determining the second reference voltage values by virtue of current Ic at the second line end being multiplied, in a frequency-related manner, by the impedance $Z(j\omega)$, in a frequency-dependent manner.

7. The method according to claim 1, which further comprises:
calculating the fictitious first reference voltage values in a frequency domain by means of the first reference voltage values by virtue of the first reference voltage values being multiplied by function $e^{j\cdot\gamma(j\omega)\cdot l}$ in a frequency-related manner; and
calculating the fictitious second reference voltage values in the frequency domain by means of the second reference voltage values by virtue of the second reference voltage values being multiplied by the function $e^{j\cdot\gamma(j\omega)\cdot l}$ in a frequency-related manner.

8. The method according to claim 1, which further comprises determining at least one of the first and second reference voltage values or the first and second fictitious reference voltage values in a time domain.

9. The method according to claim 1, which further comprises:
calculating a term $Ia\cdot Z(j\omega)$ in a time domain when determining the first reference voltage values by virtue of the current sampled values of a current at the first line end being numerically filtered using a first filter reproducing a response of the impedance $Z(j\omega)$; and
calculating a term $Ic\cdot Z(j\omega)$ in the time domain when determining the second reference voltage values by virtue of the current sampled values of a current at the second line end being numerically filtered using the first filter or another filter reproducing a response of the impedance $Z(j\omega)$.

10. The method according to claim 1, which further comprises:
calculating the fictitious first reference voltage values in a time domain by means of the first reference voltage values by virtue of the first reference voltage values being numerically filtered by a second filter reproducing function $e^{j\cdot\gamma(j\omega)\cdot l}$; and
calculating the fictitious second reference voltage values in the time domain by means of the second reference voltage values by virtue of the second reference voltage values being numerically filtered by the second filter, or another filter reproducing the function $e^{j\cdot\gamma(j\omega)\cdot l}$.

11. The method according to claim 9, wherein:
the first filter has a first order IIR filter and a root former disposed downstream thereof, wherein the first filter takes into account frequency dependence of the impedance of the electric line; or
the first filter has a multiplication element which multiplies current sampled values by a constant impedance value, wherein the first filter does not take into account the frequency dependence of the impedance of the electric line.

12. The method according to claim 10, wherein the second filter takes account of the frequency dependence of damping and the frequency dependence of the propagation constants of the electric line and has at least one of an FIR filter or an IIR filter.

13. A fault locating device for determining a fault location in a case of a fault on an electric line or on a line section of the electric line, comprising:
a computer connected to a first line end of the electric line or line section at a first measuring position and to a second line end of the electric line or line section at a second measuring position;
a data memory connected to said computer, said data memory containing software modules functioning as reference voltage formers, propagation reproducers, difference formers, and an evaluation unit;
a processor device of said computer executing said software modules such that:
said reference voltage formers form first and second reference voltage values on a basis of current and voltage sampled values at the first line end of the electric line or the line section, current and voltage sampled values at the second line end of the electric line or the line section, and an impedance of the electric line;
said propagation reproducers form fictitious first and fictitious second reference voltage values on a basis of a wave guiding model, describing a wave response of the electric line, and the first and second reference voltage values, with the fictitious first reference voltage values, in a fault-free case, corresponding to the second reference voltage values at the second line end and the fictitious second reference voltage values, in the fault-free case, corresponding to the first reference voltage values at the first line end; and
said difference formers generate a first fictitious fault voltage signal by forming a difference between the second fictitious reference voltage values and the first reference voltage values and a second fictitious fault voltage signal by forming a difference between the first fictitious reference voltage values and the second reference voltage values;
said evaluation unit subjects the first and second fictitious fault voltage signals to a cross correlation and a cross correlation function is established, said evaluation unit determining the fault location on a basis of a temporal shift of a maximum of the cross correlation function in relation to a mid position in a results window of the cross correlation function, and said evaluation unit using the determined fault location to locate the fault on the electric line or the line section of the electric line; and
said evaluation unit further generates a short circuit warning signal indicating a fault on the electric line or the line section of the electric line if a fault is detected.

14. A computer program product stored on a nontransitory computer readable storage medium for determining, when executed by a processor, a fault location in a case of a fault on an electric line or on a line section of the electric line, said computer program product comprising:
reference voltage formers forming first and second reference voltage values on a basis of current and voltage sampled values at a first line end of the electric line or the line section, current and voltage sampled values at a second line end of the electric line or the line section, and an impedance of the electric line;
propagation reproducers forming fictitious first and fictitious second reference voltage values on a basis of a wave guiding model, describing a wave response of the electric line, and the first and second reference voltage values, with the fictitious first reference voltage values, in a fault-free case, corresponding to the second reference voltage values at the second line end and the fictitious second reference voltage values, in the fault-free case, corresponding to the first reference voltage values at the first line end; and
said difference formers generating a first fictitious fault voltage signal by forming a difference between the second fictitious reference voltage values and the first reference voltage values and a second fictitious fault voltage signal by forming a difference between the first fictitious reference voltage values and the second reference voltage values;

an evaluation unit subjecting the first and second fictitious fault voltage signals to a cross correlation and a cross correlation function is established, said evaluation unit determining the fault location on a basis of a temporal shift of a maximum of the cross correlation function in relation to a mid position in a results window of the cross correlation function, said evaluation unit using the determined fault location to locate the fault on the electric line or the line section of the electric line;

said evaluation unit further generating a short circuit warning signal indicating a fault on the electric line or the line section of the electric line if a fault is detected.

\* \* \* \* \*